(12) United States Patent
Choi

(10) Patent No.: US 12,438,014 B2
(45) Date of Patent: Oct. 7, 2025

(54) LIGHT IRRADIATION APPARATUS, SUBSTRATE DEBONDING SYSTEM INCLUDING THE SAME, AND SUBTRATED DEBONDING METHOD USING THE SAME

(71) Applicant: SAMSUNG ELECTRONICS CO., LTD., Suwon-si (KR)

(72) Inventor: Jaehyuk Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 76 days.

(21) Appl. No.: 18/141,013

(22) Filed: Apr. 28, 2023

(65) Prior Publication Data

US 2024/0087921 A1     Mar. 14, 2024

(30) Foreign Application Priority Data

Sep. 14, 2022   (KR) ........................ 10-2022-0115687

(51) Int. Cl.
*B32B 43/00*   (2006.01)
*H01L 21/67*   (2006.01)

(52) U.S. Cl.
CPC ...... *H01L 21/67132* (2013.01); *B32B 43/006* (2013.01); *Y10T 156/1158* (2015.01); *Y10T 156/1917* (2015.01)

(58) Field of Classification Search
CPC ............ B32B 43/006; Y10T 156/1158; Y10T 156/1917
See application file for complete search history.

(56) References Cited

U.S. PATENT DOCUMENTS

| | | | |
|---|---|---|---|
| 9,252,057 B2 | 2/2016 | Chowdhury et al. | |
| 2008/0023639 A1 | 1/2008 | Kawasaki et al. | |
| 2010/0236089 A1 | 9/2010 | Kawasaki et al. | |
| 2016/0049325 A1* | 2/2016 | Paramio Joves | ... B32B 37/0046 156/247 |

FOREIGN PATENT DOCUMENTS

| | | |
|---|---|---|
| JP | 5324130 B2 | 10/2013 |
| JP | 5690909 B2 | 3/2015 |
| JP | 6132571 B2 | 5/2017 |
| JP | 6153337 B2 | 6/2017 |
| KR | 101372394 B1 | 3/2014 |

* cited by examiner

*Primary Examiner* — Philip C Tucker
*Assistant Examiner* — Nickolas R Harm
(74) *Attorney, Agent, or Firm* — Sughrue Mion, PLLC

(57) ABSTRACT

A light irradiation apparatus including a stage configured to support a substrate; and a light emitting diode (LED) module spaced apart from the stage, wherein the LED module includes a plurality of LEDs, wherein some of the plurality of LEDs are arranged in a first direction, and wherein others of the plurality of LEDs are provided in a second direction, the second direction intersecting the first direction.

9 Claims, 12 Drawing Sheets

LIGHT IRRADIATION APPARATUS, SUBSTRATE DEBONDING SYSTEM INCLUDING THE SAME, AND SUBTRATED DEBONDING METHOD USING THE SAME

CROSS-REFERENCE TO RELATED APPLICATION

This application claims priority to Korean Patent Application No. 10-2022-0115687, filed on Sep. 14, 2022, in the Korean Intellectual Property Office, the disclosure of which is incorporated by reference herein in its entirety.

BACKGROUND

The present disclosure relates to a light irradiation apparatus, a substrate debonding system including the same, and a substrate debonding method using the same, and more particularly, to a light irradiation apparatus capable of performing a process at low power, a substrate debonding system including the same, and a substrate debonding method using the same.

A semiconductor device may be fabricated by using various processes. For example, a semiconductor device may be manufactured by allowing a silicon wafer to undergo a photolithography process, an etching process, a deposition process, and so forth. A glass substrate may be used to support a thin wafer in such processes. Such processes may be performed in a state that the glass substrate is combined with the wafer. After such a process, it may be required that the glass substrate be separated from the wafer. Many methods may be employed to separate the glass substrate from the wafer.

SUMMARY

One or more example embodiments provide a light irradiation apparatus capable of saving power consumption, a substrate debonding system including the same, and a substrate debonding method using the same.

One or more example embodiments provide a light irradiation apparatus capable of promptly performing processes, a substrate debonding system including the same, and a substrate debonding method using the same.

One or more example embodiments provide a light irradiation apparatus capable of increasing yields, a substrate debonding system including the same, and a substrate debonding method using the same.

According to an aspect of an example embodiment, a light irradiation apparatus includes: a stage configured to support a substrate; and a light emitting diode (LED) module spaced apart from the stage, wherein the light emitting diode (LED) module includes a plurality of light emitting diodes (LEDs), wherein some of the plurality of light emitting diodes (LEDs) are arranged in a first direction, and wherein others of the plurality of light emitting diodes (LEDs) are provided in a second direction, the second direction intersecting the first direction.

According to an aspect of an example embodiment, a substrate debonding system includes: a light irradiation apparatus that irradiates ultraviolet (UV) radiation; and a debonding apparatus that separates a glass substrate from a substrate that has passed through the light irradiation apparatus, wherein the light irradiation apparatus comprises: a stage; and a light emitting diode (LED) module spaced apart from the stage, wherein the light emitting diode (LED) module comprises: a base plate; and a plurality of light emitting diodes (LEDs) that are bonded to the base plate and irradiate light toward a lower side of the base plate, wherein the light irradiated from each of the plurality of light emitting diodes (LEDs) has a wavelength of from about 200 nm to about 280 nm.

According to an aspect of an example embodiment, a substrate debonding method includes: irradiating light to a substrate assembly; and after irradiating the light, separating a glass substrate from a substrate of the substrate assembly, wherein irradiating the light to the substrate assembly comprises: placing the substrate assembly on a stage of a light irradiation apparatus; and allowing a light emitting diode (LED) module of the light irradiation apparatus to irradiate ultraviolet (UV) radiation to the substrate assembly.

BRIEF DESCRIPTION OF DRAWINGS

The above and other aspects and features will be more apparent from the following description of example embodiments, taken in conjunction with the accompanying drawings, in which.

DETAILED DESCRIPTION OF EMBODIMENTS

Figure 1:
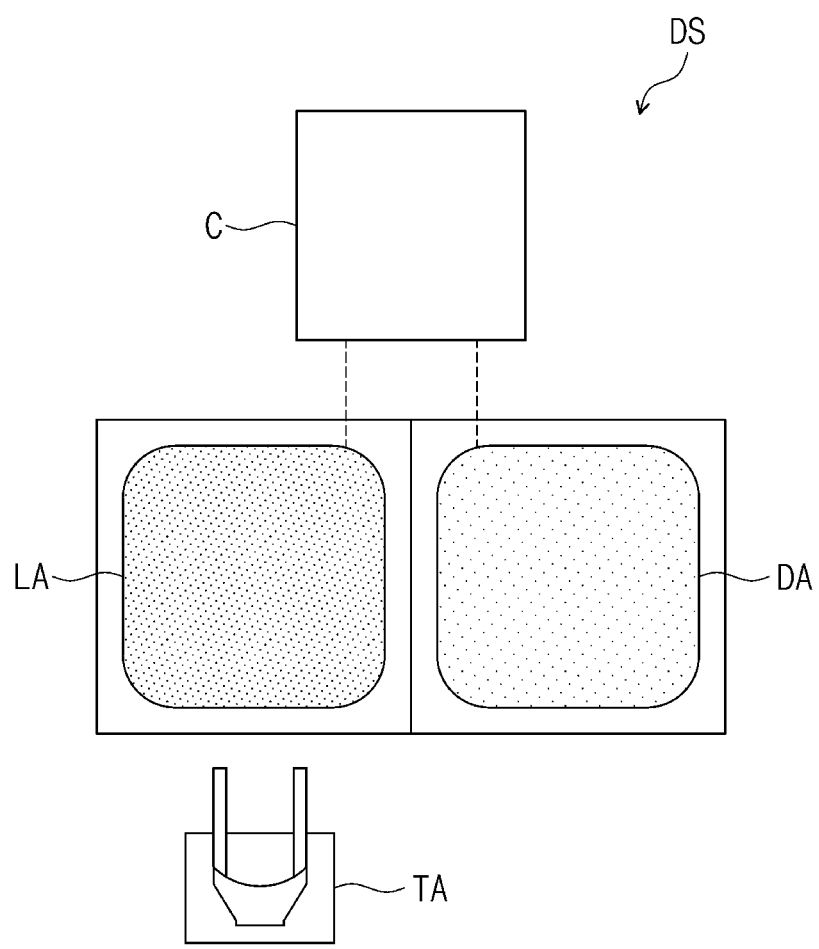
FIG. 1 illustrates a simplified schematic diagram showing a substrate debonding system according to some embodiments.

Example embodiments will be described more fully with reference to the accompanying drawings, in which example embodiments are shown. Embodiments described herein are provided as examples, and thus, the present disclosure is not limited thereto, and may be realized in various other forms. Each embodiment provided in the following description is not excluded from being associated with one or more features of another example or another embodiment also provided herein or not provided herein but consistent with the present disclosure. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. Like reference numerals may indicate like components throughout the description.

FIG. 1 illustrates a simplified schematic diagram showing a substrate debonding system according to some embodiments.

Referring to FIG. 1, a substrate debonding system DS may be provided. The substrate debonding system DS may be a device to separate one or more components from a substrate. For example, the substrate debonding system DS may be a device to separate a glass substrate from a substrate. A term "substrate" used in this description may denote a silicon (Si) wafer, but embodiments are not limited thereto. Many processes may be performed in a state that the glass substrate is combined with the substrate. A substrate assembly may refer to the assembly of a substrate and a glass substrate attached to the substrate. The substrate and the glass substrate may be attached to each other through an adhesion layer. A detailed description of an embodiment will be further discussed below. After processes, it may be required that the glass substrate be separated from the substrate. The substrate debonding system DS may be configured to separate the glass substrate from the substrate. The substrate debonding system DS may include a light irradiation apparatus LA, a substrate debonding apparatus DA, and a controller C.

The light irradiation apparatus LA may irradiate light to the substrate assembly. For example, the light irradiation apparatus LA may irradiate light to the adhesion layer of the substrate assembly. An ultraviolet (UV) ray may be adopted as the light irradiated from the light irradiation apparatus LA. When the light irradiation apparatus LA irradiates the light to the substrate assembly, a photochemical reaction may occur in the adhesion layer. Therefore, the glass substrate may be easily separated from the substrate. A detailed description an embodiment will be further discussed below.

The substrate debonding apparatus DA may separate the glass substrate from the substrate of the substrate assembly that has passed through the light irradiation apparatus LA. The substrate assembly, which is irradiated with the light from the light irradiation apparatus LA, may be transferred by a transfer unit TA to the substrate debonding apparatus DA. The substrate debonding apparatus DA may use a vacuum chuck to adsorb or hold the glass substrate, and then may separate the glass substrate from the substrate. A detailed description of an embodiment will be further discussed below.

The controller C may control one or both of the light irradiation apparatus LA and the substrate debonding apparatus DA. For example, the controller C may control an amount of time during which the light irradiation apparatus LA irradiates the light to the substrate assembly. A detailed description of an embodiment will be further discussed below.

Figure 2:
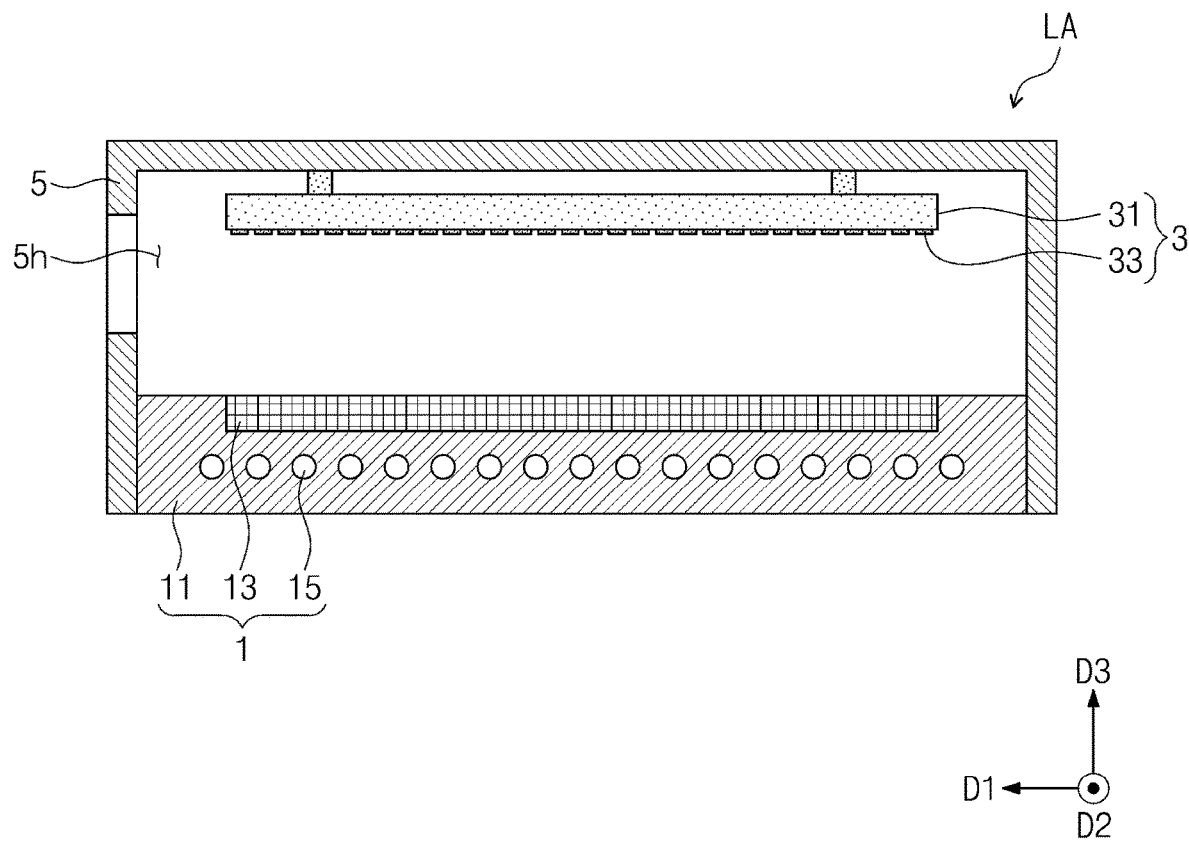
FIG. 2 illustrates a cross-sectional view showing a light irradiation apparatus according to some embodiments.

FIG. 2 illustrates a cross-sectional view showing a light irradiation apparatus according to some embodiments.

In this description, symbol D1 may indicate a first direction, symbol D2 may indicate a second direction that intersects the first direction D1, and symbol D3 may indicate a third direction that intersects each of the first direction D1 and the second direction D2. The first direction D1 may be a horizontal direction, the second direction D2 may be a horizontal direction, and the third direction D3 may be a vertical direction. The first direction D1, the second direction D2, and the third direction D3 may intersect or may be orthogonal to one another.

Referring to FIG. 2, the light irradiation apparatus LA may include a stage 1, a light emitting diode (LED) module 3, and a cover 5.

The stage 1 may support a substrate. For example, a substrate assembly may be disposed on the stage 1. In a state that the substrate assembly is disposed on the stage 1, light may be irradiated toward the substrate assembly. The stage 1 may rigidly place and set the substrate assembly on a certain or fixed position. In addition, the stage 1 may adjust a temperature of the substrate assembly. The stage 1 may include a stage body 11, a porous chuck 13, and a cooling passage 15.

The stage body 11 may support the porous chuck 13. When viewed in plan, an area of the stage body 11 may be greater than an area of the substrate body.

The porous chuck 13 may be positioned on the stage body 11. The porous chuck 13 may fix the substrate assembly. For example, the porous chuck 13 may use vacuum pressure to rigidly hold the substrate assembly on a certain or fixed position. The porous chuck 13 may have a porous structure. In addition, the porous chuck 13 may be connected to a vacuum pump (not shown). Vacuum pressure provided by the vacuum pump may cause the porous chuck 13 to fix the substrate assembly to a certain position.

The cooling passage 15 may be provided in the stage body 11. A fluid, such as cooling water, may flow in the cooling passage 15. The cooling passage 15 may be connected to a cooling water supply (not shown).

The LED module 3 may be upwardly spaced apart from the stage 1 so that the LED module 3 is disposed vertically above the stage 1. The LED module 3 may irradiate a light beam toward the stage 1. The LED module 3 may include a base plate 31 and a light emitting diode (LED) 33. The base plate 31 may support the LED 33. For example, the LED 33 may be combined with the base plate 31. The LED 33 may irradiate light toward a substrate. The light irradiated from the LED 33 may be ultraviolet (UV) radiation. The light irradiated from the LED 33 may have a wavelength ranging from about 200 nm to about 280 nm. For example, the light irradiated from the LED 33 may have a wavelength ranging from about 250 nm to about 255 nm. The light irradiated from the LED 33 may be ultraviolet-C (UVC) radiation. The LED 33 may be provided in plural. The plurality of LEDs 33 may be disposed spaced apart from each other in a horizontal direction. For example, some of the plurality of LEDs 33 may be spaced apart from each other in a first direction D1. In addition, others of the plurality of LEDs 33 may be spaced apart from each other in a second direction D2. A detailed description of an embodiment will be further discussed below.

The cover 5 may be disposed around and envelop the stage 1 and the LED module 3. The cover 5 may define a light irradiation space 5h. As shown in FIG. 2, in an embodiment, the cover 5 may include an opening.

Figure 3:
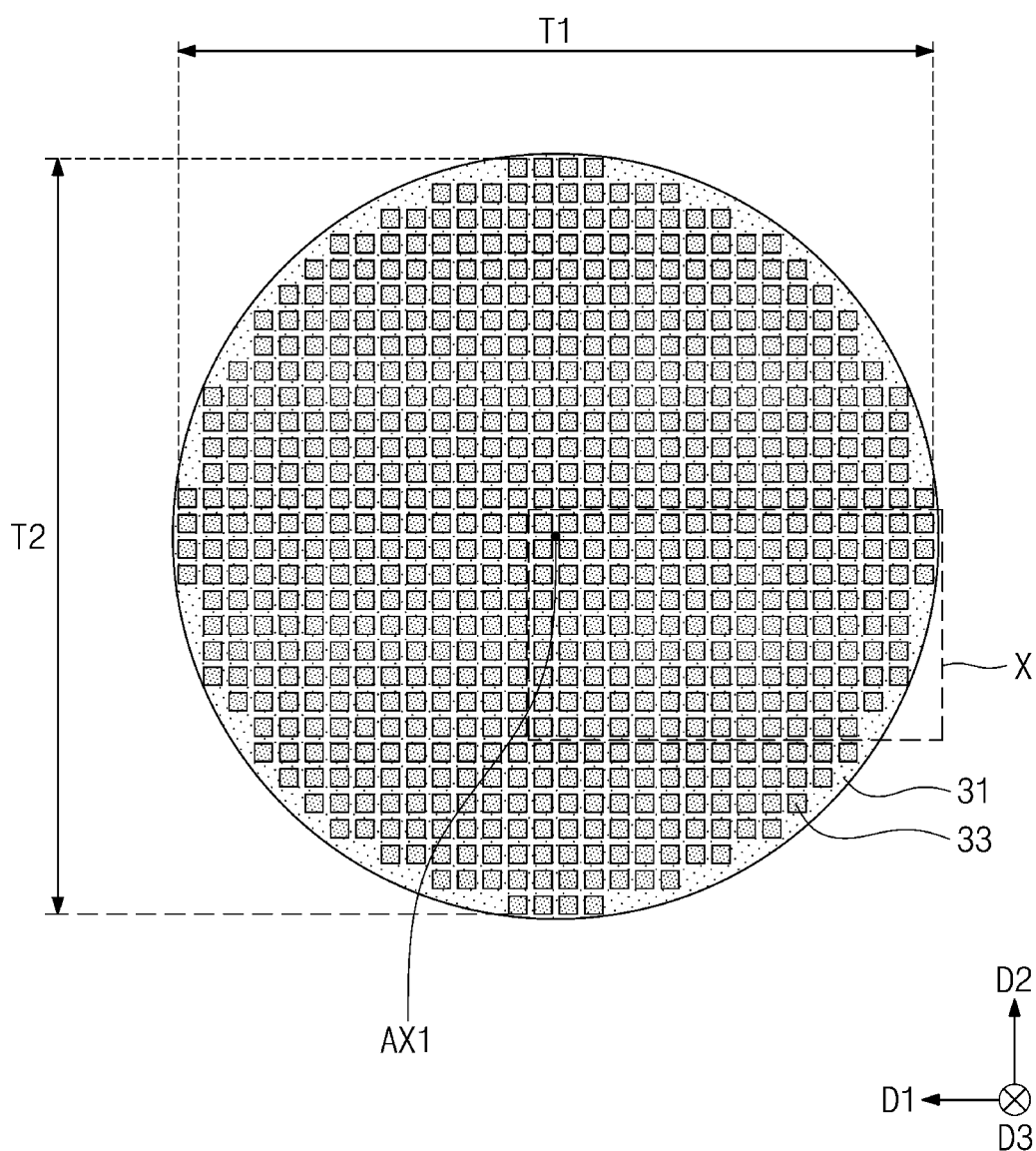
FIG. 3 illustrates a bottom view showing an LED module according to some embodiments.

FIG. 3 illustrates a bottom view showing an LED module according to some embodiments.

Referring to FIG. 3, the plurality of LEDs 33 may be disposed such that they are spaced apart from each other in a horizontal direction. The base plate 31 may be provided with the plurality of LEDs 33 on a portion of a bottom surface thereof, which portion of the bottom surface may be referred to as a placement region.

Some of the plurality of LEDs 33 may be arranged in the first direction D1. A first distance T1 may be provided as a distance between two LEDs 33 that are located farthest away from each other in the first direction D1 among the plurality of LEDs 33. The first distance T1 may be equal to or greater than about 300 mm. For example, the first distance T1 may range from about 305 mm to about 315 mm. A value equal to or greater than about 300 mm may be given as a maximum width in the first direction D1 of a region where the plurality of LEDs are disposed.

Others of the plurality of LEDs 33 may be arranged in the second direction D2. A second distance T2 may be provided as a distance between two LEDs 33 that are located farthest away from each other in the second direction D2 among the plurality of LEDs 33. The second distance T2 may be equal to or greater than about 300 mm. For example, the second distance T2 may range from about 305 mm to about 315 mm. A value equal to or greater than about 300 mm may be given as a maximum width in the second direction D2 of a region where the plurality of LEDs are disposed.

In some embodiments, the base plate 31 may have a circular shape. In addition, among the plurality of LEDs 33, outermost ones may be arranged in a circular shape. For example, among the plurality of LEDs 33, ones located farthest away from an axis AX1 may be arranged to form a circular shape. For example, the placement region may have a circular shape. Embodiments, however, are not limited thereto, and the plurality of LEDs 33 may be arranged to form another shape such as, for example, a rectangular shape when viewed in plan.

Figure 4:
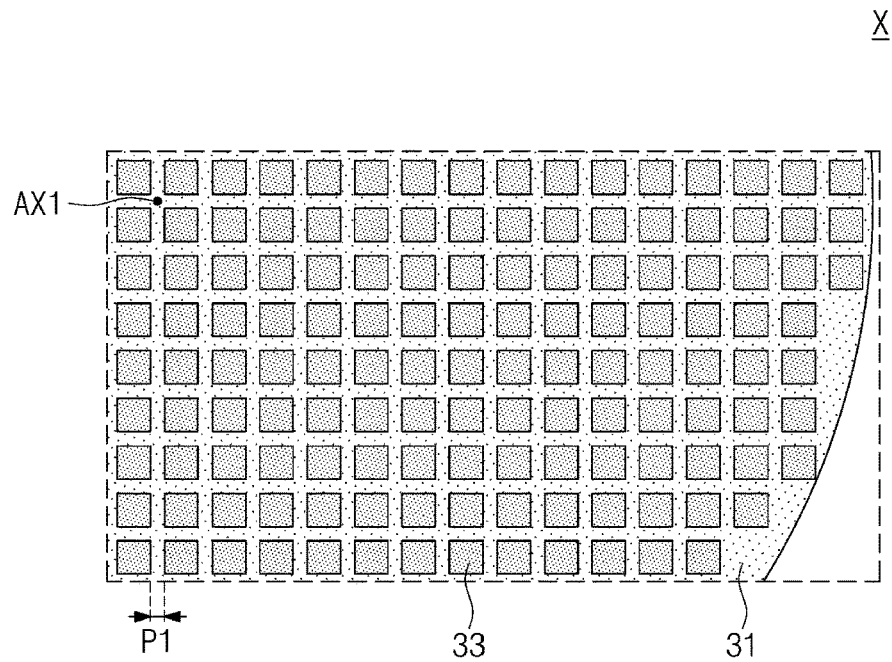
FIG. 4 illustrates an enlarged bottom view showing section X of FIG. 3.

FIG. 4 illustrates an enlarged bottom view showing section X of FIG. 3.

Referring to FIG. 4, an interval P1 between the plurality of LEDs 33 may range from about 6 mm to about 14 mm. For example, the interval P1 between two neighboring ones among the plurality of LEDs 33 may range from about 8 mm to about 12 mm. Embodiments, however, are not limited thereto. Unless otherwise specified below, the following will describe a single LED 33.

Figure 5:
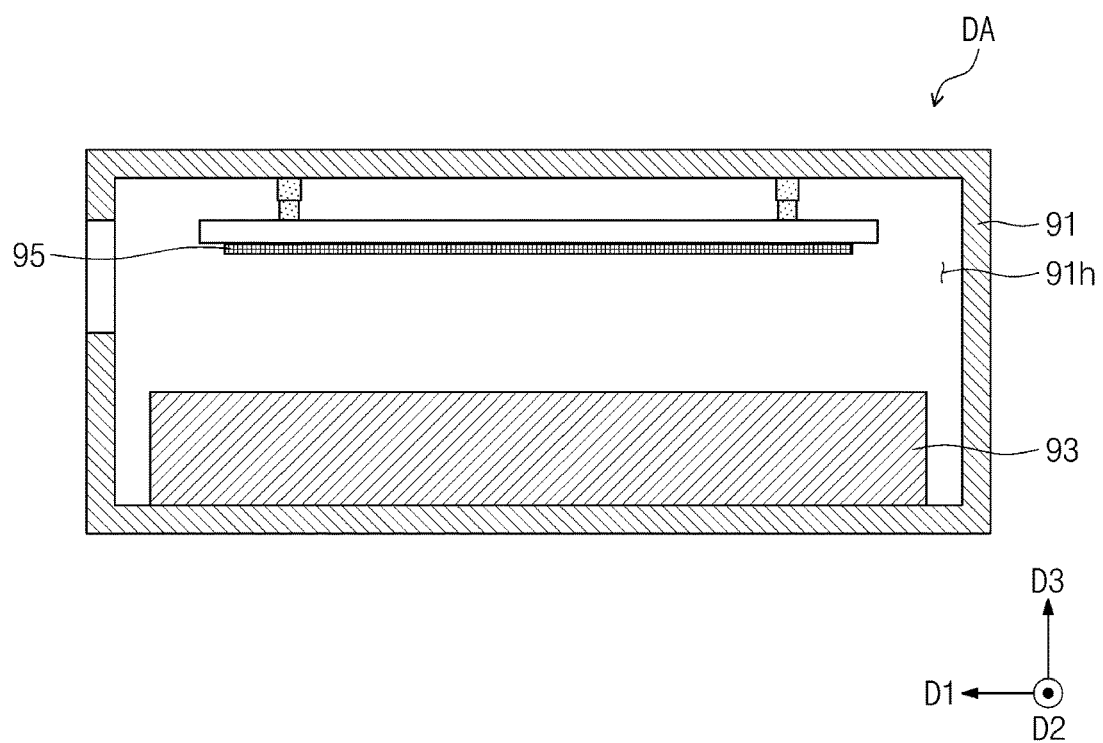
FIG. 5 illustrates a cross-sectional view showing a substrate debonding apparatus according to some embodiments.

FIG. 5 illustrates a cross-sectional view showing a substrate debonding apparatus according to some embodiments.

Referring to FIG. 5, the substrate debonding apparatus DA may include a debonding chamber 91, a debonding stage 93, and a vacuum chuck 95. The debonding chamber 91 may provide a debonding space 91h. The debonding chamber 91 may be disposed around and envelop the debonding stage 93 and the vacuum chuck 95.

The debonding stage 93 may support a substrate. The debonding stage 93 may rigidly set and place a substrate on a certain or fixed position. The debonding stage 93 may include an electrostatic chuck (ESC). Embodiments, however, are not limited thereto, and the debonding stage 93 may use vacuum pressure to fix a substrate.

The vacuum chuck 95 may be upwardly spaced apart from the debonding stage 93 such that the vacuum chuck 95 is vertically above the debonding stage 93. The vacuum chuck 95 may include a porous structure. The vacuum chuck 95 may adsorb or hold a glass substrate. The vacuum chuck 95 may be connected to a vacuum pump (not shown). A detailed description of an embodiment will be further discussed below.

Figure 6:
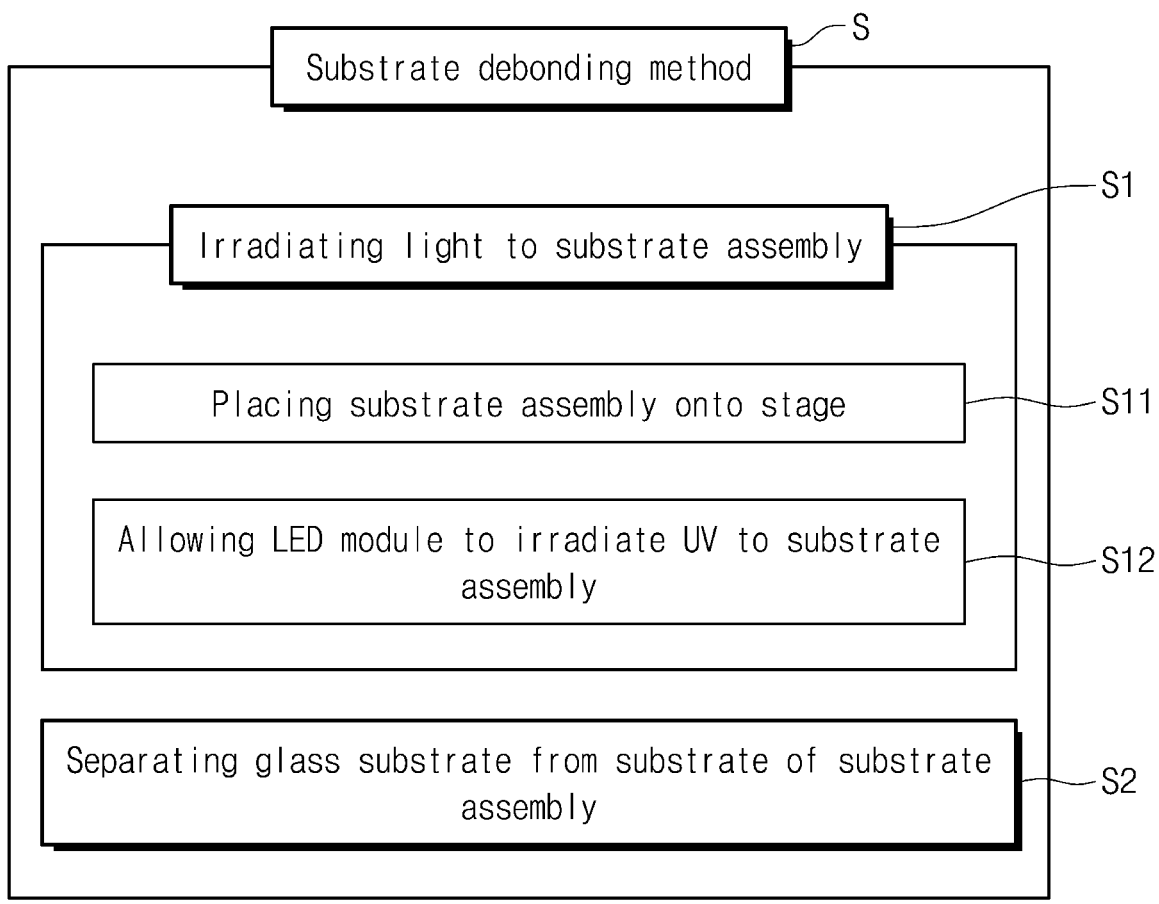
FIG. 6 illustrates a flow chart showing a substrate debonding method according to some embodiments.

FIG. 6 illustrates a flow chart showing a substrate debonding method according to some embodiments.

Referring to FIG. 6, a substrate debonding method S may be provided. The substrate debonding method S may use the substrate debonding system (see DS of FIG. 1), which is discussed with reference to FIGS. 1 to 5, to separate a glass substrate from a substrate. The substrate debonding method S may include a step S1 of irradiating light to a substrate assembly and a step S2 of separating a glass substrate from a substrate.

The light irradiation step S1 may include a step S11 of placing the substrate assembly on a stage and a step S12 of allowing an LED module to irradiate ultraviolet (UV) radiation to the substrate assembly.

A substrate debonding method of FIG. 6 will be described below with reference to FIGS. 7 to 15.

FIGS. 7 to 15 illustrate diagrams showing a substrate debonding method according to the flow chart of FIG. 6.

Figure 7:
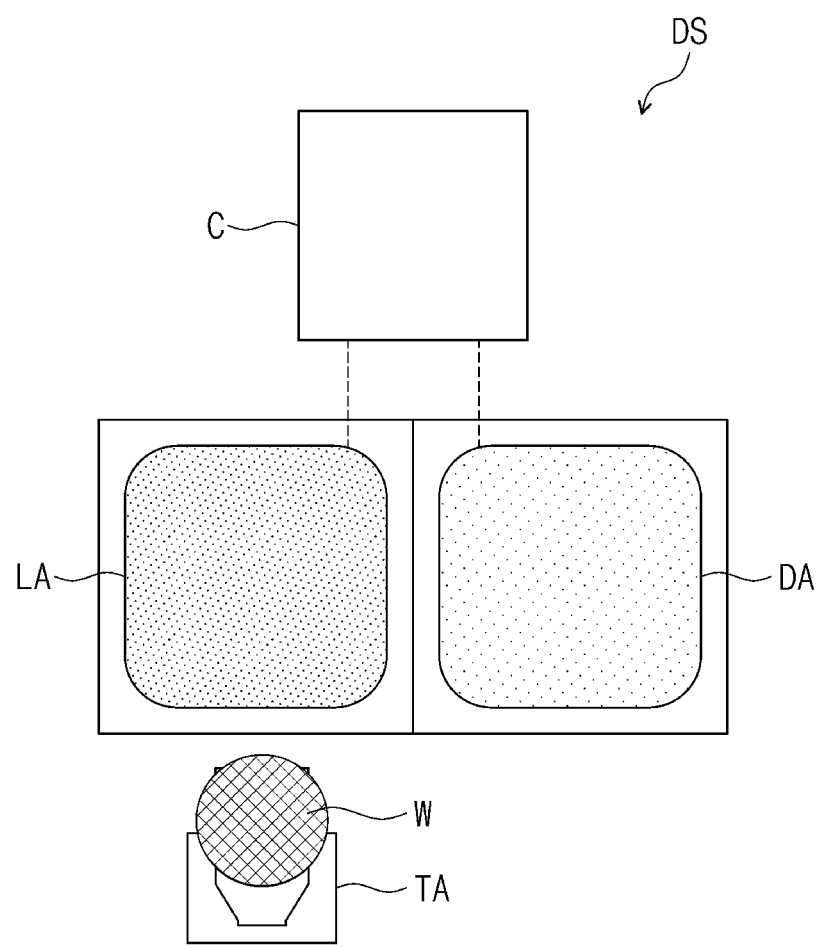
FIGS. 7 to 15 illustrate diagrams showing a substrate debonding method according to the flow chart of FIG. 6.
Figure 8:
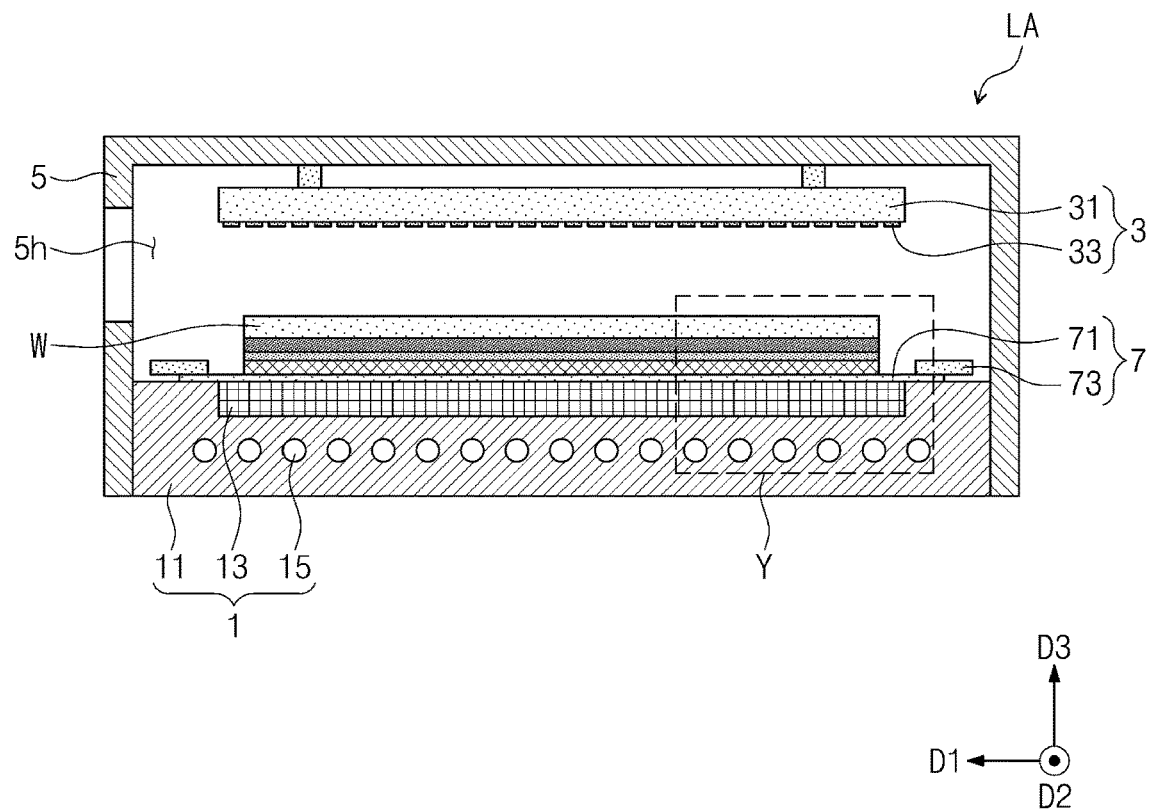

Referring to FIGS. 6, 7, and 8, the placement step S11 may include placing a substrate assembly W on the porous chuck 13. The porous chuck 13 may use vacuum pressure to fix the substrate assembly W. For example, when a vacuum pump (not shown) provides the porous chuck 13 with vacuum pressure, the substrate assembly W may be fixed onto the porous chuck 13. Embodiments, however, are not limited thereto, and any other suitable methods may be used to fix the substrate assembly W onto the stage 1. For example, an electrostatic force may be employed to fix the substrate assembly W onto the stage 1.

Figure 9:
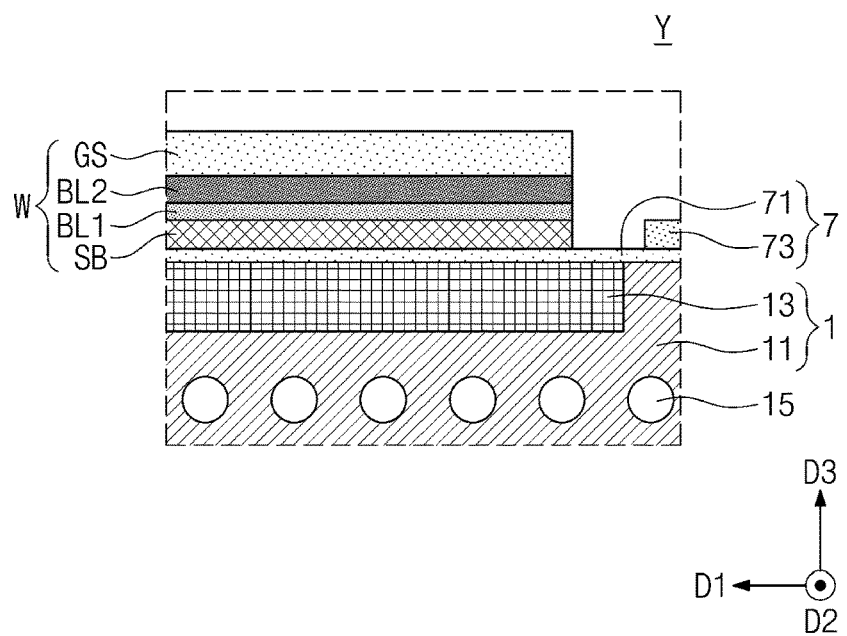

Referring to FIG. 9, the substrate assembly W may include a substrate SB, a first adhesion layer BL1, a second adhesion layer BL2, and a glass substrate GS.

The substrate SB may include a silicon wafer. The substrate SB may be transferred while being disposed on a substrate support structure 7. Even when the substrate SB is fixed onto the stage 1, the substrate SB may be positioned on the substrate support structure 7. For example, the porous chuck 13 may fix the substrate support structure 7. The substrate support structure 7 may include a support layer 71 and a ring frame 73. The substrate SB may be disposed on a top surface of the support layer 71. The ring frame 73 may be coupled to an outer side of the support layer 71. The ring frame 73 may include a material whose stiffness is greater than that of the support layer 71. Therefore, the ring frame 73 may support the support layer 71. A force may be applied to the ring frame 73 to deliver the support layer 71 and the substrate SB on the support layer 71.

The first adhesion layer BL1 may be disposed on the substrate SB. The first adhesion layer BL1 may attach the substrate SB and the second adhesion layer BL2 to each other. For example, the substrate SB and the second adhesion layer BL2 may be bonded to each other through the first adhesion layer BL1.

The second adhesion layer BL2 may be positioned on the first adhesion layer BL1. The second adhesion layer BL2 may attach the first adhesion layer BL1 and the glass substrate GS to each other. The second adhesion layer BL2 may attach the first adhesion layer BL1 and the glass substrate GS to each other. When light is irradiated to the second adhesion layer BL2, a photochemical reaction may occur in the second adhesion layer BL2. In this case, the second adhesion layer BL2 may include an ultraviolet-C (UVC) curable adhesive. For example, when ultraviolet (UV) radiation is irradiated to the second adhesion layer BL2, nitrogen ($N_2$) may be produced from the second adhesion layer BL2. When nitrogen ($N_2$) is produced in the second adhesion layer BL2, the second adhesion layer BL2 may have a reduced adhesive force. Therefore, the glass substrate GS may be easily separated from the first adhesion layer BL1.

The glass substrate GS may be positioned on the second adhesion layer BL2. The glass substrate GS may be bonded to the substrate SB through the first adhesion layer BL1 and the second adhesion layer BL2. The glass substrate GS may have a thickness greater than that of the substrate SB. The glass substrate GS may be transparent to light. For example, the glass substrate GS may allow ultraviolet (UV) radiation to pass therethrough.

Figure 10:
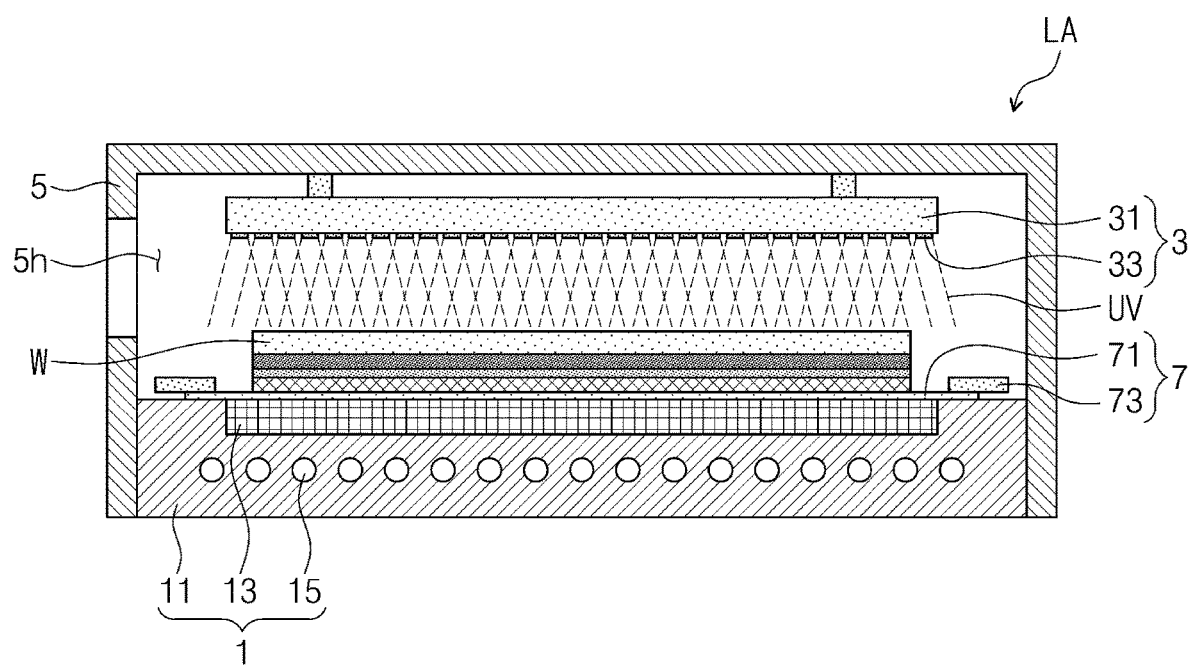

Referring to FIGS. 6 and 10, the UV irradiation step S12 may include allowing the LED 33 to irradiate light UV. Each of the plurality of LEDs 33 may irradiate the light UV whose wavelength is in a range of about 200 nm to about 280 nm. For example, the light UV irradiated from the LED 33 may be ultraviolet (UV) radiation. The irradiated light UV may reach the substrate assembly W. The light UV may pass through the glass substrate GS. The light UV may reach the second adhesion layer BL2. When the light UV is irradiated to the second adhesion layer BL2, a photochemical reaction may occur in the second adhesion layer BL2. Therefore, nitrogen ($N_2$) may be produced in the second adhesion layer BL2. In some embodiments, the UV irradiation step S12 may be executed for about 2 minutes to about 7 minutes. For example, the UV irradiation step S12 may be executed for about 3 minutes to about 6 minutes. Embodiments, however, are not limited thereto, and an amount of process time may be changed in accordance with detailed design.

Figure 11:
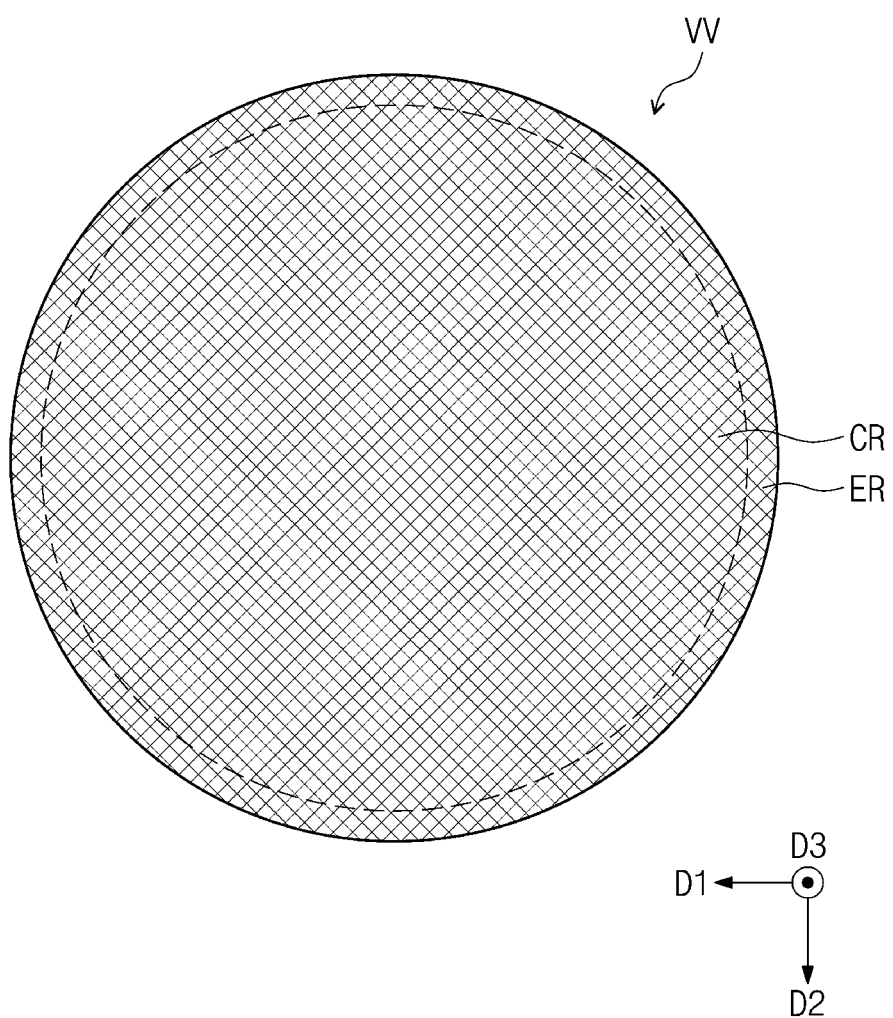

Referring to FIG. 11, nitrogen ($N_2$) may be produced in the substrate assembly W to which light is irradiated. In this step, a relatively large amount of light may be irradiated to a central region CR of the substrate assembly W. A relatively small amount of light may be irradiated to an edge region ER of the substrate assembly W. Referring back to FIG. 10, the light UV irradiated from the LED 33 may spread in a horizontal direction while traveling toward the substrate assembly W. Therefore, when light beams irradiated from two neighboring LEDs 33 reach the substrate assembly W, the light beams irradiated from the two neighboring LEDs 33 may overlap each other. Therefore, a relatively large amount of light may reach the central region CR of FIG. 11. Accordingly, nitrogen ($N_2$) may be produced relatively early from the central region CR. In contrast, a relatively small amount of light may reach the edge region ER. Therefore, nitrogen ($N_2$) may be produced relatively late from the edge region ER.

Figure 12:
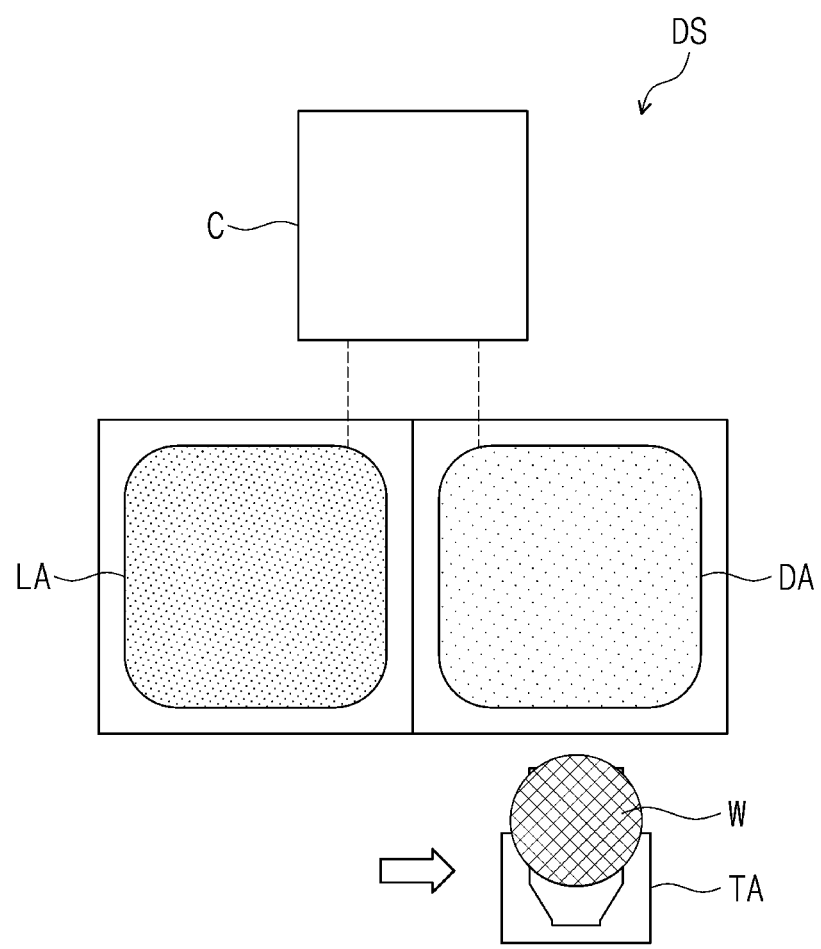
Figure 13:
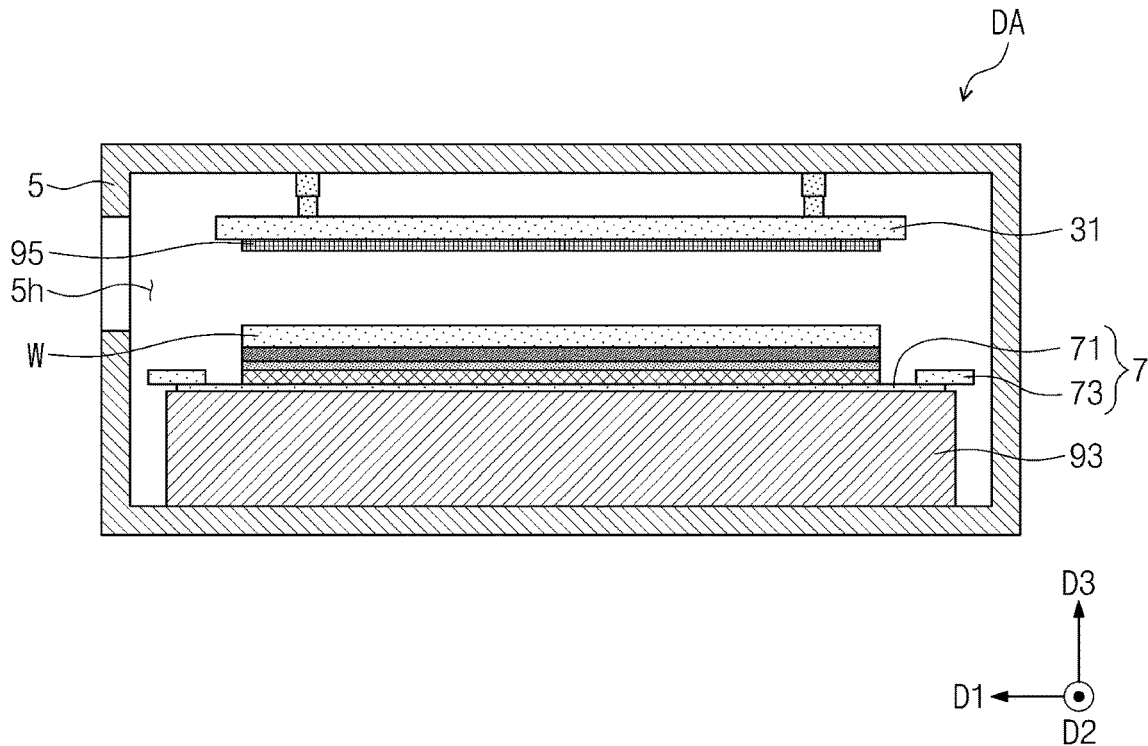

Referring to FIGS. 6, 12, and 13, the separation step S2 may include placing a substrate assembly into a debonding apparatus and using the debonding apparatus to separate a glass substrate from a substrate.

Referring to FIG. 13, the placement of the substrate assembly may include placing the substrate assembly W onto the debonding stage 93. In this step, the substrate assembly W may be disposed on the substrate support structure 7. The debonding stage 93 may support and/or fix the substrate assembly W.

The separation of the glass substrate may include fixing the glass substrate to a vacuum chuck of the debonding apparatus and separating the glass substrate from the substrate.

Figure 14:
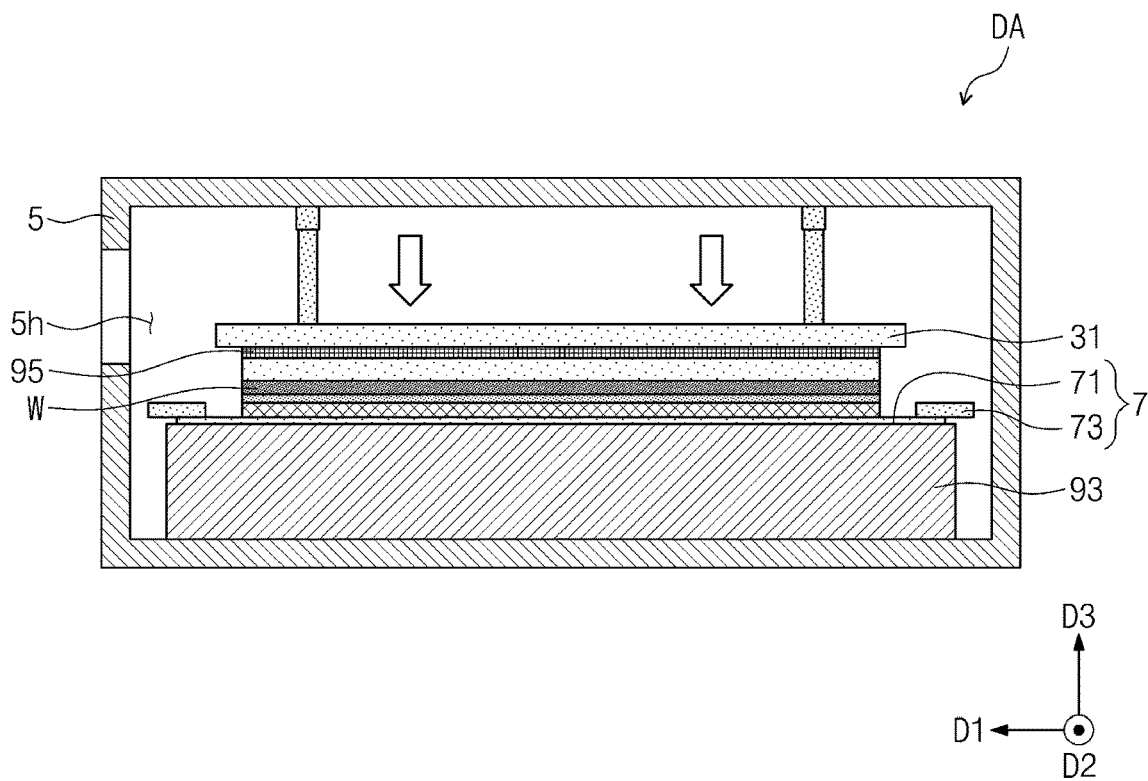

Referring to FIG. 14, the fixation of the glass substrate may include descending the vacuum chuck 95 to contact a top surface of the substrate assembly W. The vacuum chuck 95 may use vacuum pressure to fix the glass substrate GS.

Figure 15:
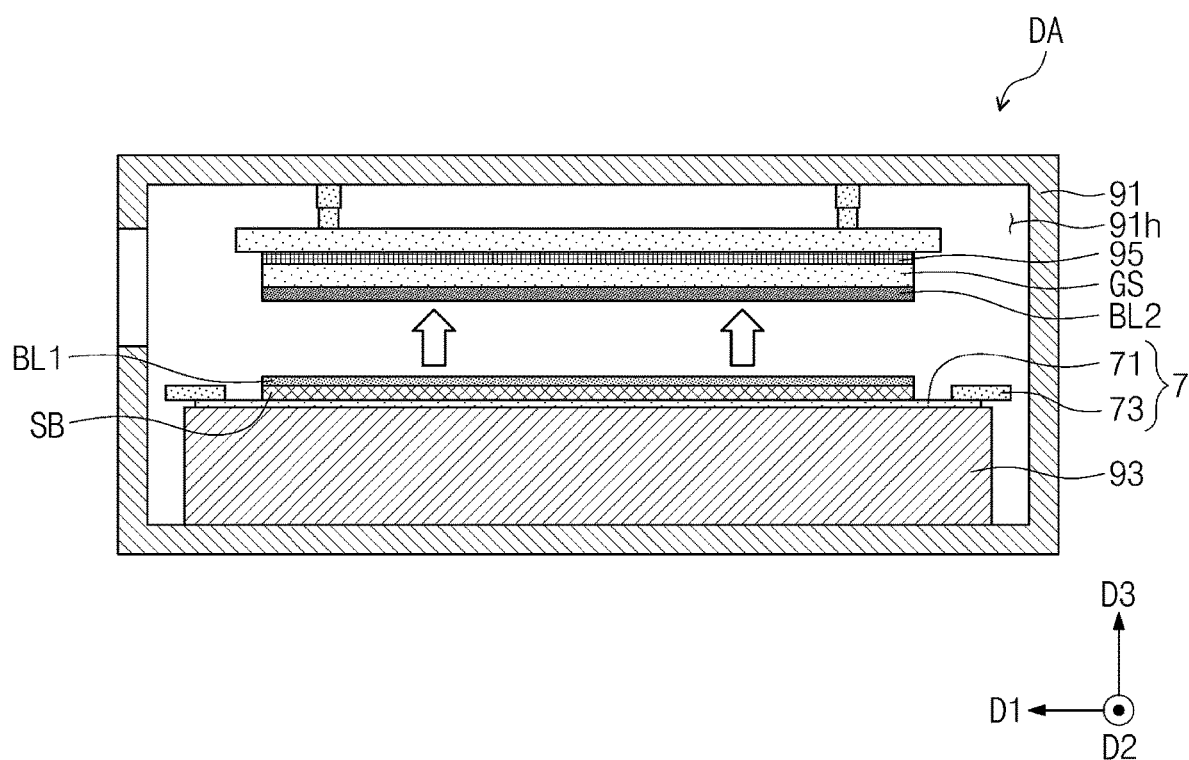

Referring to FIG. 15, the separation of the glass substrate may include ascending the vacuum chuck 95 to which the glass substrate GS is fixed. In accordance with the ascent of the vacuum chuck 95, the glass substrate GS may also ascend. In a state where an adhesive force of the second adhesion layer BL2 is reduced due to the production of nitrogen ($N_2$) in the second adhesion layer BL2, the glass substrate GS and/or the second adhesion layer BL2 may be easily separated from the first adhesion layer BL1. Accordingly, the glass substrate GS may be separated from the substrate SB.

According to a light irradiation apparatus, a substrate debonding system including the same, and a substrate debonding method using the same in accordance with some embodiments, a light emitting diode (LED) may be used to irradiate light to a substrate assembly. Thus, it may be possible to decrease power consumption required for the light irradiation. In addition, it may be possible to reduce an amount of heat generated from a light source. Accordingly, no cooling mechanism may be separately needed to accomplish cooling of the light source.

According to a light irradiation apparatus, a substrate debonding system including the same, and a substrate debonding method using the same in accordance with some embodiments, as the LED is used which produces a small amount of heat and whose price is inexpensive, a great number of LEDs may be used to allow light to concurrently reach an entire surface of the substrate assembly. The light may thus reach at once the entire surface of the substrate assembly. For example, a plurality of LEDs may be arranged in a circular shape similar to that of the substrate assembly, and the plurality of LEDs may be used to simultaneously irradiate the light to the entire surface of the substrate assembly. Accordingly, an amount of process time may be reduced.

According to a light irradiation apparatus, a substrate debonding system including the same, and a substrate debonding method using the same in accordance with some embodiments, because the light is simultaneously irradiated to the entire surface of the substrate assembly, nitrogen ($N_2$) may be uniformly produced in an adhesion layer. Hence, when a glass substrate is separated from a substrate, a uniform separation process may be accomplished. As a result, a process yield may increase.

According to a light irradiation apparatus, a substrate debonding system including the same, and a substrate debonding method using the same in accordance with some embodiments, power consumption may be reduced.

According to a light irradiation apparatus, a substrate debonding system including the same, and a substrate debonding method using the same in accordance with some embodiments, a prompt process may be achieved.

According to a light irradiation apparatus, a substrate debonding system including the same, and a substrate debonding method using the same in accordance with some embodiments, a yield may increase.

Effects of the embodiments are not limited to the mentioned above, other effects which have not been mentioned above will be clearly understood to those skilled in the art from the following description.

While aspects of example embodiments have been particularly shown and described, it will be understood that various changes in form and details may be made therein without departing from the spirit and scope of the following claims.

What is claimed is:
1. A substrate debonding method, comprising:
  irradiating light to a substrate assembly; and
  after irradiating the light, separating a glass substrate of the substrate assembly from a substrate of the substrate assembly,
  wherein irradiating the light to the substrate assembly comprises:
    placing the substrate assembly, including the glass substrate and the substrate, on a stage of a light irradiation apparatus; and
    irradiating, by a light emitting diode (LED) module of the light irradiation apparatus and through the glass substrate in a first direction towards the stage, ultraviolet (UV) radiation to an adhesion layer of the substrate assembly, the adhesion layer being between the glass substrate and the substrate,
  wherein the LED module comprises a plurality of LEDs,
  wherein some of the plurality of LEDs are arranged in a second direction, the second direction intersecting the first direction, wherein others of the plurality of LEDs are arranged in a third direction, the third direction intersecting the second direction, and wherein outermost LEDs among the plurality of LEDs are arranged in a circular shape.

2. The substrate debonding method of claim 1, wherein the UV radiation has a wavelength of from about 200 nm to about 280 nm when the UV radiation is irradiated to the substrate assembly.

3. The substrate debonding method of claim 1, wherein irradiating the UV radiation to the substrate assembly comprises simultaneously irradiating the UV radiation to an entire top surface of the substrate assembly.

4. The substrate debonding method of claim 1, wherein an interval between the plurality of LEDs is in a range of from about 8 mm to about 12 mm.

5. The substrate debonding method of claim 1, wherein separating the glass substrate from the substrate comprises:

placing the substrate assembly into a debonding apparatus; and using the debonding apparatus to separate the glass substrate from the substrate.

6. The substrate debonding method of claim 5, wherein using the debonding apparatus to separate the glass substrate from the substrate comprises:

fixing the glass substrate to a vacuum chuck of the debonding apparatus; and ascending the vacuum chuck to separate the glass substrate from the substrate.

7. The substrate debonding method of claim 1, wherein irradiating the UV radiation to the substrate assembly is performed for in a range of from about 3 minutes to about 6 minutes.

8. The substrate debonding method of claim 1, wherein the placing comprises fixing the substrate assembly, including the glass substrate and the substrate, to the stage of the light irradiation apparatus such that the substrate assembly is overlapped by the LED module, and wherein the irradiating comprises irradiating, by the LED module, the UV radiation to the adhesion layer while the substrate assembly is fixed to the stage.

9. The substrate debonding method of claim 1, wherein the UV radiation has a wavelength of from about 200 nm to about 280 nm when the UV radiation is irradiated to the substrate assembly, and wherein the irradiating comprises simultaneously irradiating the UV radiation, that has the wavelength, to an entire top surface of the substrate assembly.

* * * * *